US011698346B2

(12) United States Patent
Barbu et al.

(10) Patent No.: US 11,698,346 B2
(45) Date of Patent: Jul. 11, 2023

(54) METHODS AND APPARATUS FOR MONITORING A MANUFACTURING PROCESS, INSPECTION APPARATUS, LITHOGRAPHIC SYSTEM, DEVICE MANUFACTURING METHOD

(71) Applicant: ASML NETHERLANDS B.V., Veldhoven (NL)

(72) Inventors: Ioana Sorina Barbu, Eindhoven (NL); Murat Bozkurt, Uden (NL); Maurits Van Der Schaar, Eindhoven (NL); Alberto Da Costa Assafrao, Veldhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 859 days.

(21) Appl. No.: 16/114,629

(22) Filed: Aug. 28, 2018

(65) Prior Publication Data
US 2019/0072496 A1 Mar. 7, 2019

(30) Foreign Application Priority Data
Sep. 4, 2017 (EP) .................................... 17189187

(51) Int. Cl.
G01N 21/88 (2006.01)
G03F 7/20 (2006.01)
(Continued)

(52) U.S. Cl.
CPC ..... *G01N 21/8806* (2013.01); *G01N 21/4788* (2013.01); *G01N 21/9501* (2013.01);
(Continued)

(58) Field of Classification Search
CPC combination set(s) only.
See application file for complete search history.

(56) References Cited

U.S. PATENT DOCUMENTS

2006/0033921 A1  2/2006  Den Boef et al.
2006/0066855 A1  3/2006  Boef et al.
(Continued)

FOREIGN PATENT DOCUMENTS

TW   2017124444   4/2017
TW   201727391    8/2017
(Continued)

OTHER PUBLICATIONS

Kandel, D., Adel, M., Dinu, B., Golovanevsky, B., Izikson, P., Levinski, V., . . . & Salski, B. (Jun. 2007). Differential signal scatterometry overlay metrology: an accuracy investigation. In Optical Measurement Systems for Industrial Inspection V (vol. 6616, pp. 138-148). SPIE. (Year: 2007).*
(Continued)

*Primary Examiner* — David Perlman
(74) *Attorney, Agent, or Firm* — Pillsbury Winthrop Shaw Pittman, LLP

(57) ABSTRACT

Multilayered product structures are formed on substrates by a combination of patterning steps, physical processing steps and chemical processing steps. An inspection apparatus illuminates a plurality of target structures and captures pupil images representing the angular distribution of radiation scattered by each target structure. The target structures have the same design but are formed at different locations on a substrate and/or on different substrates. Based on a comparison of the images the inspection apparatus infers the presence of process-induced stack variations between the different locations. In one application, the inspection apparatus separately measures overlay performance of the manufacturing process based on dark-field images, combined with previously determined calibration information. The calibration is adjusted for each target, depending on the stack variations inferred from the pupil images.

20 Claims, 8 Drawing Sheets

(51) Int. Cl.
*G01N 21/95* (2006.01)
*G01N 21/47* (2006.01)
*G01N 21/956* (2006.01)
*H01L 21/66* (2006.01)
*G03F 7/00* (2006.01)

(52) U.S. Cl.
CPC ....... *G01N 21/95607* (2013.01); *G03F 7/705* (2013.01); *G03F 7/7065* (2013.01); *G03F 7/70525* (2013.01); *G03F 7/70616* (2013.01); *G03F 7/70633* (2013.01); *H01L 22/12* (2013.01)

(56) References Cited

U.S. PATENT DOCUMENTS

| | | |
|---|---|---|
| 2008/0043239 A1 | 2/2008 | Boef et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2012/0242970 A1 | 9/2012 | Smilde et al. |
| 2013/0135600 A1 | 5/2013 | Middlebrooks et al. |
| 2013/0258310 A1 | 10/2013 | Smilde et al. |
| 2013/0271740 A1 | 10/2013 | Quintanilha |
| 2014/0192338 A1 | 7/2014 | Den Boef |
| 2015/0138523 A1 | 5/2015 | Jak et al. |
| 2016/0180517 A1 | 6/2016 | Fuchs et al. |
| 2016/0290796 A1 | 10/2016 | Levy et al. |
| 2016/0334715 A1 | 11/2016 | Smilde et al. |
| 2017/0153558 A1 | 6/2017 | Tel et al. |
| 2017/0206649 A1 | 7/2017 | Bozkurt et al. |
| 2018/0023950 A1* | 1/2018 | Marciano ............ G03F 7/70616 702/150 |

FOREIGN PATENT DOCUMENTS

| | | |
|---|---|---|
| TW | 201728991 | 8/2017 |
| WO | 2017-108453 | 6/2017 |
| WO | 2017-146786 | 8/2017 |

OTHER PUBLICATIONS

Taiwanese Office Action issued in corresponding Taiwanese Patent Application No. 107130774, dated Nov. 13, 2019.
International Search Report and Written Opinion issued in corresponding PCT Patent Application No. PCT/EP2018/072237, dated Nov. 27, 2018.

* cited by examiner

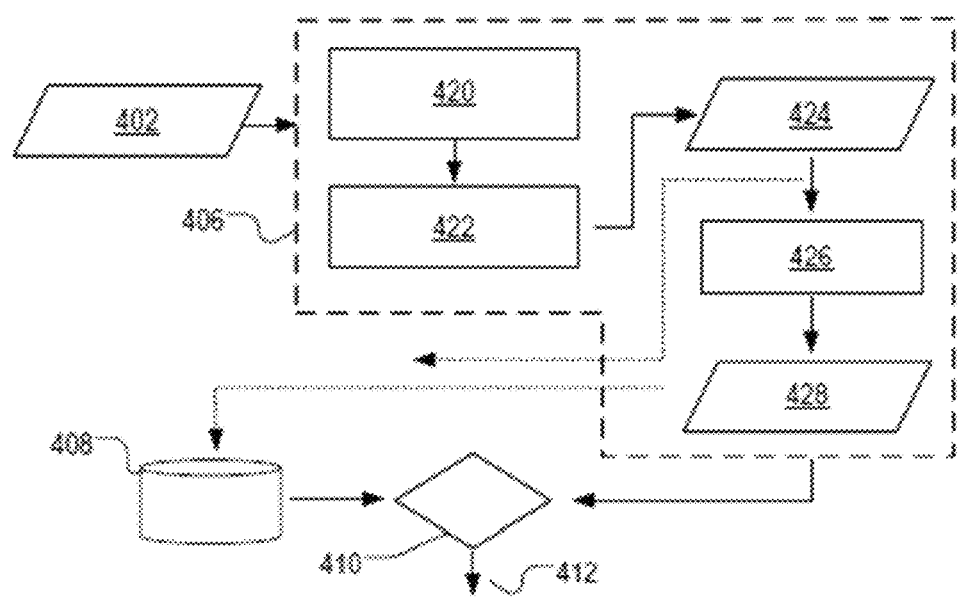
Fig. 4
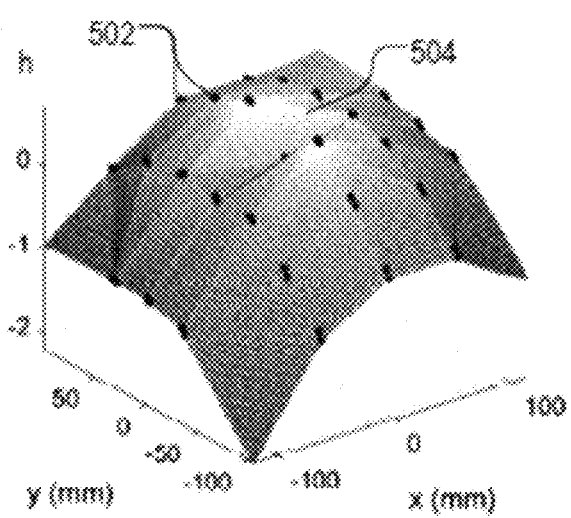
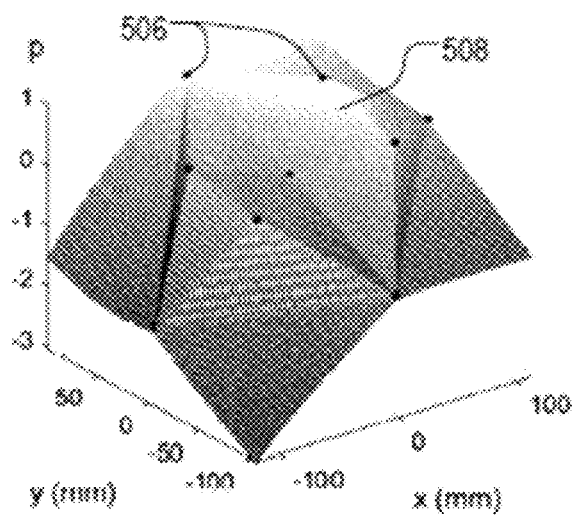
Fig. 5A　　　　　　　　　　Fig. 5B

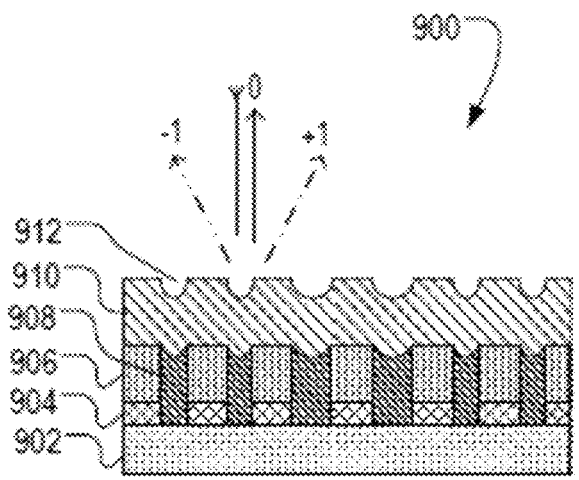
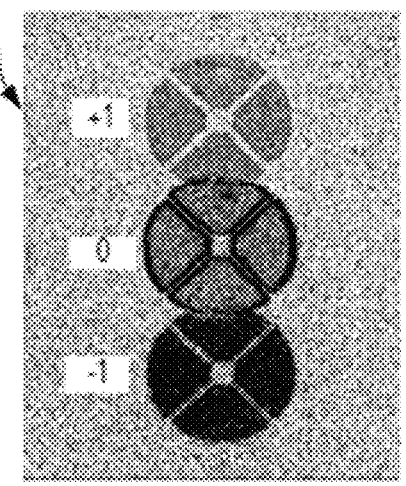
Fig. 9A Fig. 9B
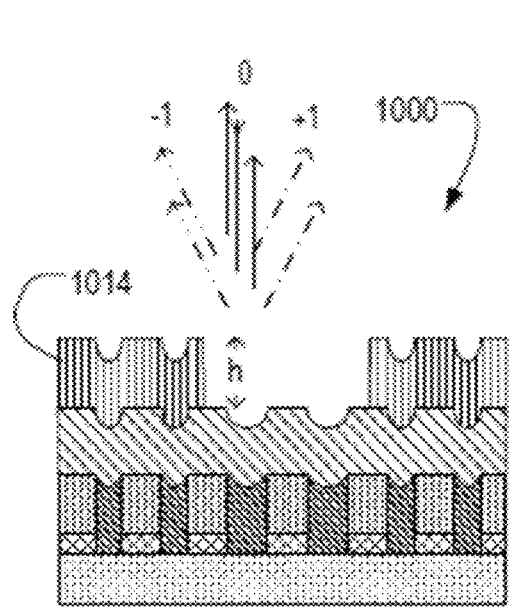
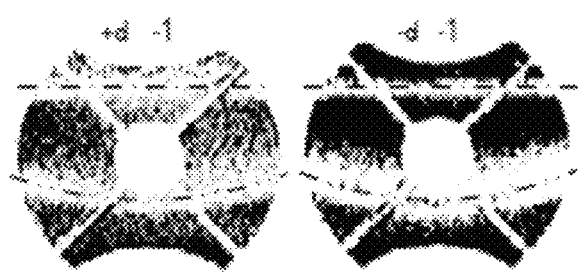
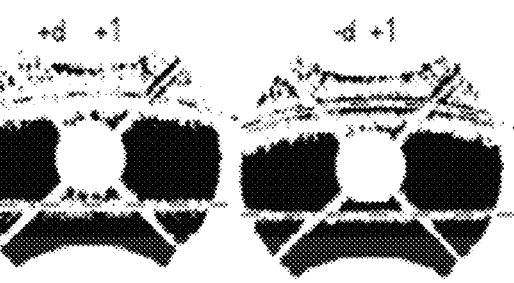
Fig. 10A Fig. 10B Fig. 10D
 Fig. 10C Fig. 10E

METHODS AND APPARATUS FOR MONITORING A MANUFACTURING PROCESS, INSPECTION APPARATUS, LITHOGRAPHIC SYSTEM, DEVICE MANUFACTURING METHOD

This application claims the benefit of priority to European patent application no. EP 17189187, filed Sep. 4, 2017, which is incorporated herein in its entirety by reference.

FIELD

This description relates to methods and apparatus for monitoring manufacturing processes, for example semiconductor manufacture using lithographic apparatus. The description further relates to inspection apparatuses, lithographic systems and device manufacturing methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of inspection apparatuses, such as scatterometers, have been developed for use in the lithographic field. Embodiments of some of these devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of scatterometers include angle-resolved scatterometers of the type described in United States patent application publication nos. US 2006-033921 and US 2010-201963, which documents are hereby incorporated by reference in their entireties. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in United States patent application publication nos. US 2006-066855 and US 2008-0043239. Diffraction-based overlay metrology using dark-field imaging of the diffraction orders enables overlay measurements on smaller targets. Examples of dark field imaging metrology can be found in United States patent application publication nos. US 2014-192338 and US 2011-069292, which documents are hereby incorporated by reference in their entireties. Further developments of the technique have been described in United States patent application publication nos. US 2011-0027704, US 2011-0043791, US 2011-102753, US 2012-0044470, US 2012-0123581, US 2012-242970, US 2013-0258310, US 2013-0271740, US 2015-138523 and US 2016-180517, which documents are hereby incorporated by reference in their entireties. These targets can be smaller than the illumination spot and may be surrounded by product structures on a substrate. Multiple gratings can be measured in one image, using a composite grating target.

SUMMARY

Using the above metrology techniques as examples, their aim generally is to measure dimensions of the structures formed in a layer of resist or other material on a substrate, and/or overlay between layers. However, there are many other variables in a lithographic manufacturing process that can influence the radiation received by the inspection apparatus. Examples of such variables are one or more properties of the materials themselves (refractive index, for example) and/or one or more layer heights (thickness) among any or all of the layers forming the "stack". Settings of the inspection apparatus may need to be carefully adjusted, and signal analysis carefully set up, in order to obtain accurate results under a given set of process conditions.

As the desired measurement accuracy increases and features become smaller and sometimes taller, process variations make it very difficult to have one setting for the entire substrate or for different batches of substrates. Accordingly, it would be useful to have more information on process variations at the time of making measurements during, e.g., high-volume manufacture. Such information can be useful in its own right, and also to refine the measurement results obtainable using a scatterometer or other inspection apparatus.

Particularly in the case of dark-field imaging, where simple metrics such as target asymmetry are derived without laborious reconstruction or other analysis techniques, additional information could be most useful, if it could be obtained without significant measurement overhead or computational overhead. Among the patent application publications cited herein, U.S. patent application publication nos. US 2008-0043239, US 2012-242970 and US 2016-180517 illustrate examples of corrections that can be applied in deriving measurements of structure properties from diffraction signals obtained in an inspection apparatus such as a scatterometer, whether in a pupil image or a dark-field image. Some of these corrections may be, for example to correct for non-ideal performance of the inspection apparatus itself, without the need to measure such non-ideal performance on every target. Optimum corrections are another example of settings that should ideally be adjusted according to process variations, if only suitable information were available.

In aspect, there is provide a method of monitoring a manufacturing process in which multilayered product structures are formed on substrates by a combination of patterning steps, physical processing steps and chemical processing steps, the method comprising:
(a) illuminating a target structure with inspection radiation;
(b) capturing at least one image representing an angular distribution of the inspection radiation after it has been scattered by the target structure;

(c) repeating steps (a) and (b) to capture images for a plurality of nominally identical target structures formed by the manufacturing process at different locations on a substrate and/or on different substrates; and (d) based on a comparison of the images for target structures having the same design but being formed at different locations on a substrate and/or on different substrates, inferring the presence of a difference in structure, between the different locations.

By comparison of pupil images or the like, the presence of a difference in structure can be inferred to obtain useful monitoring information, without inferring a specific difference in structure. Thus, the monitoring information can be obtained by image processing, with minimal additional measurement and without the computational overhead of reconstruction or similar techniques.

In some embodiments, the method is applied to improve measurement of one or more performance parameters such as overlay and/or CD. In one such embodiment the method further comprises:

(e) determining a parameter of performance of the manufacturing process by measuring a plurality of target structures that have been subject to the same process steps as the target structures used in step (b), wherein in step (e) the measurement for each target structure is determined partly on basis of the differences in structure inferred in step (d) for a target structure measured in step (b) at a corresponding location and/or substrate.

In some embodiments, the measurements made in step (e) use previously determined calibration information to determine the parameter of performance based on measurement signals obtained from the target structures, and the calibration information is adjusted for each target depending on the difference inferred.

In an aspect, there is provided an apparatus for monitoring a manufacturing process in which multilayered product structures are formed on substrates by a combination of patterning steps, physical processing steps and chemical processing steps, the apparatus comprising:

a processor arranged to:
  receive a plurality of images, each image representing an angular distribution of inspection radiation after it has been scattered by a corresponding target structure,
  make a comparison of the plurality of images for target structures having the same design but being formed at different locations on a substrate and/or on different substrates, and
  based on the comparison, infer the presence of a difference in structure, between the different locations.

The apparatus may be implemented within an inspection apparatus such as a scatterometer. In one embodiment, the processor is arranged to calculate measurements of process performance based on dark-field imaging, while adjusting the calibration of those measurements based on comparison of pupil images captured by the same optical system.

In an aspect, there is provided a lithographic system comprising:

a lithographic apparatus comprising an illumination optical system arranged to illuminate a pattern and a projection optical system arranged to project an image of the pattern onto a substrate; and an apparatus for monitoring as set forth herein, wherein the lithographic apparatus is controlled at least partly in response to the presence of a difference inferred by the processor of the apparatus for monitoring.

In an aspect, there is provided a computer program comprising processor readable instructions which, when run on a suitable processor controlled apparatus, cause the processor controlled apparatus to perform a method as described herein. The instructions may be stored in non-transient form on a carrier.

In an aspect, there is provided methods of manufacturing devices wherein a device pattern is applied to a series of substrates using a lithographic process, the method including using an aspect described above to monitor focus performance and/or aberration performance of the lithographic apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings, in which:

FIG. 4 illustrates in more detail one implementation of the method of FIG. 3;

FIG. 5A illustrates correlation between a physical property measured by a conventional technique;

FIG. 5B illustrates correlation between an image parameter obtained by the principles of an embodiment of the present invention;

FIGS. 9A and 9B illustrate the recognition and classification of pupil image features in a first example target structure;

FIGS. 10A, 10B, 10C, 10D and 10E illustrate the recognition and classification of pupil image features in a first example target structure;

DETAILED DESCRIPTION OF EXEMPLARY EMBODIMENTS

Before describing embodiments of the invention in detail, it is instructive to present an example environment in which embodiments of the present invention may be implemented.

Figure 1:
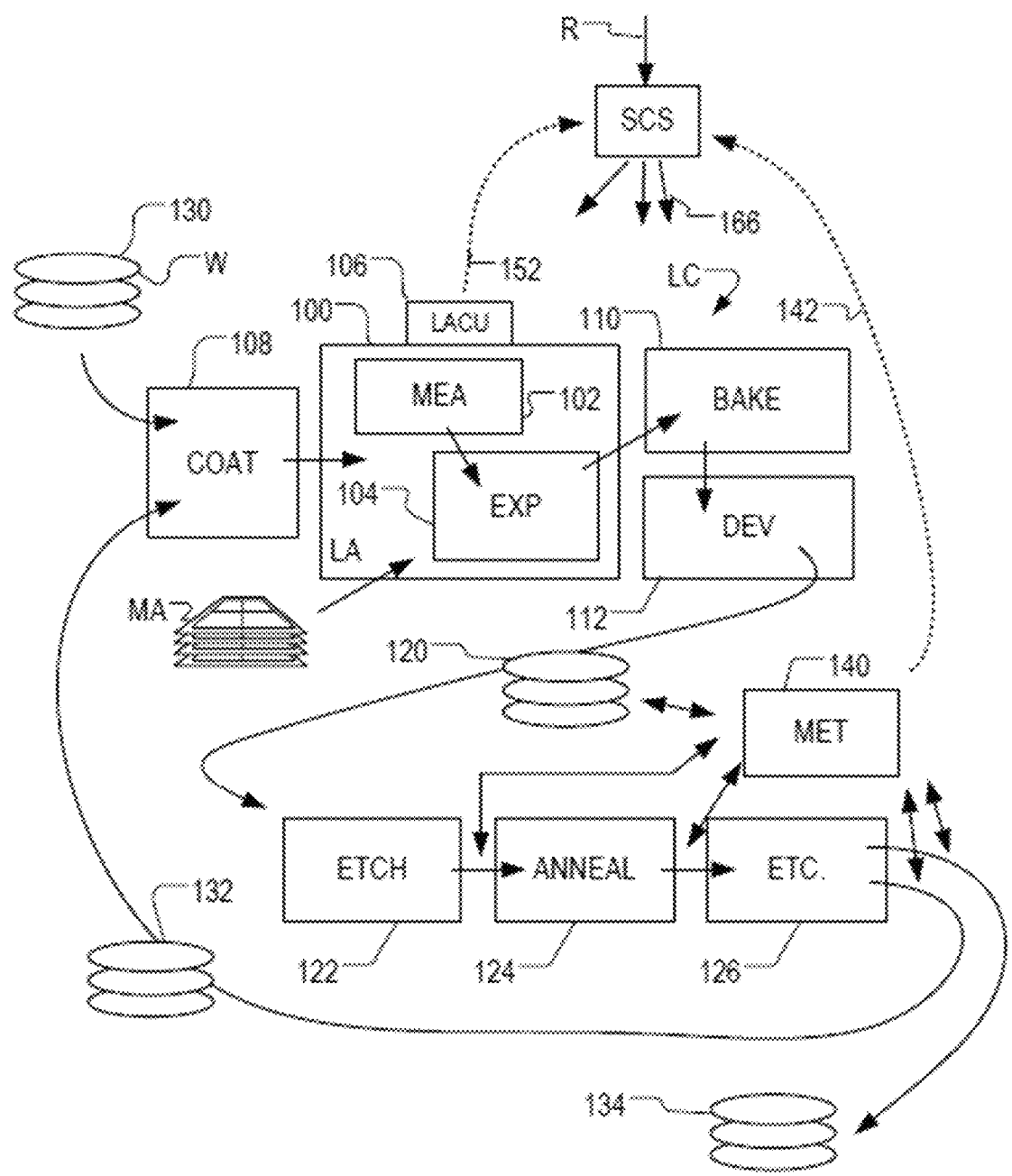
FIG. 1 depicts a lithographic apparatus together with other apparatuses forming a production facility for, for example, semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and patterning devices MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" LC that contains also a coating apparatus COAT or 108 for applying photosensitive resist and other coatings to substrates W for patterning by the apparatus 100. At an output side of apparatus 100, a baking apparatus BAKE or 110 and developing apparatus DEV or 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate, and produces one or more signals 166 for control, etc. of one or more apparatuses. In an embodiment, the supervisory control system SCS receives information 152 from one or more apparatuses such as lithographic apparatus control unit LACU to enable, for example, creation of the one or more control signals 166.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus ANNEAL or 124 performs a post-etch annealing step. Further physical and/or chemical processing steps are applied in one or more further apparatuses labelled ETC or 126. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure typically involves a different set of process steps, and the one or more apparatuses 122, 124, 126 used at each layer may be completely different in type. Further, even where the processing steps to be applied by the one or more apparatuses 122, 124, 126 are nominally the same, in a large facility, there may be several supposedly identical machines working in parallel to perform the step 122, 124 and/or 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore, some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus MET or 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the etching apparatus ETCH or 122. Using metrology apparatus 140, it may be determined, for example, that a performance parameter such as overlay or critical dimension (CD) does not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit 106 making small adjustments over time, thereby reducing or minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Figure 2A:
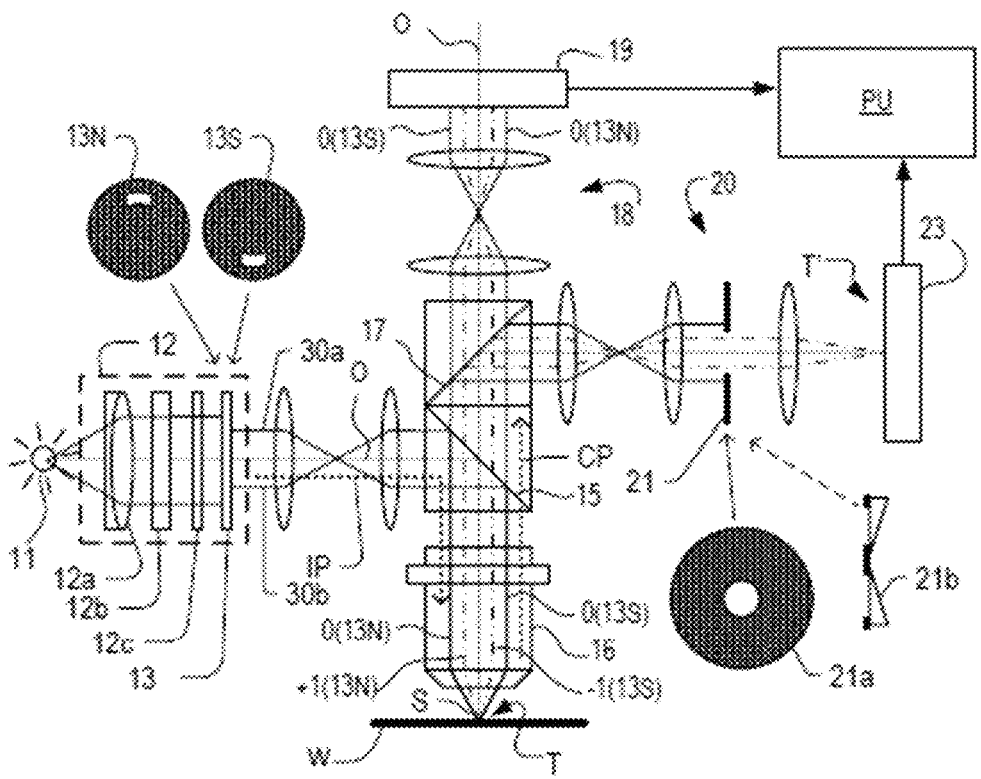
FIG. 2A illustrates schematically an inspection apparatus adapted to perform inspection methods.

FIG. 2A shows schematically the key elements of an inspection apparatus. In this example, the inspection apparatus is designed to perform angle-resolved scatterometry, including so-called dark field imaging. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 2B.

As described in patent application publications cited herein, the apparatus of FIG. 2A may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), desirably at least 0.9 or at least 0.95. Immersion fluid can be used to obtain numerical apertures over 1 if desired. Further increases in NA can be obtained by use of solid immersion lens (SIL) techniques, including micro-SIL and equivalents.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in patent application publications cited herein.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (e.g., color) and/or polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of radiation incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different locations in the illumination pupil plane and used selectively to deliver radiation or not deliver radiation at their respective locations. These variants are all discussed and exemplified in the documents cited above.

Figure 2B:
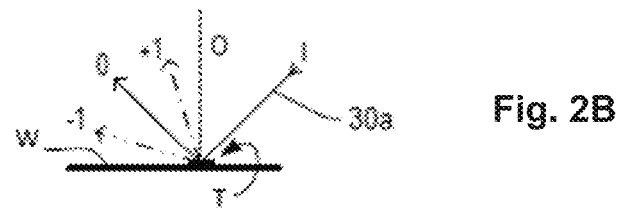
FIG. 2B illustrates schematically diffraction of radiation from a target.

In a first example illumination mode, aperture 13N is used and rays 30a are provided so that the angle of incidence is as shown at T in FIG. 2B. The path of the zero order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 2A, the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 2B, target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line O) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, radiation from partially reflective surface 17 enters imaging optical system 20, which forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain a measurement of one or more performance parameters of the lithographic process used to form them. The one or more performance parameters that can be measured in this way include for example overlay, focus and/or dose. Special designs of targets are provided to allow measurement of different performance parameters to be made through the same basic asymmetry measurement method.

Referring again to FIG. 2B and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30a, and so the −1 order diffracted rays enter the objective and contribute to the image. Aperture stop 21a blocks the zeroth order radiation when using off-axis illumination. As described in patent application publications cited herein, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted radiation to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique, is disclosed in U.S. patent application publication no. US 2011-102753, the entire content of which is hereby incorporated by reference. 2nd, 3rd and higher order beams (not shown in FIGS. 2A and 2B) can be used in measurements, instead of or in addition to the first order beams. As a further variation, the off-axis illumination mode can be kept constant, while the target itself is rotated 180 degrees beneath objective lens 16 to capture images using the opposite diffraction orders.

While a conventional lens-based imaging system is illustrated, the techniques disclosed herein can be applied equally with plenoptic cameras, and also with so-called "lensless" or "digital" imaging systems. There is therefore a large degree of design choice, as to which parts of the processing system for the diffracted radiation are implemented in the optical domain and which are implemented in the electronic and software domains. While the following examples refer to a "pupil image" as a representation of angular distribution of radiation, in a lensless system, a representation of angular distribution of radiation may be captured in a detector plane which is not strictly a pupil plane, but is distorted. Accordingly, a "pupil image" is only one example of what may be used as an image representing the angular distribution.

The inspection apparatus of FIG. 2 is presented purely as one example of an inspection apparatus in which the principles of the present disclosure may be applied. Scatter patterns captured by pupil sensor 19 represent the angular distribution of inspection radiation after it has been scattered by the target structure, and can be used to infer the presence of a difference in structure, while the field image sensor 23 is used to make high-volume measurements and target structures across one or more substrates. Such measurements can also be made by other types of sensors, for example using the pupil image sensor 19 itself, and/or using spectroscopic sensors and/or sensors for ellipsometry.

Figure 3:
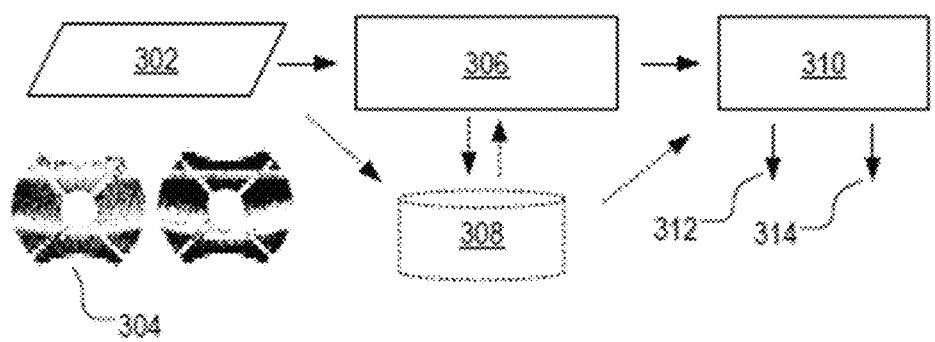
FIG. 3 illustrates schematically steps in a method of monitoring a manufacturing process according to principles of an embodiment of the present invention.

Referring now to FIG. 3, there is illustrated in block schematic form a method of monitoring a manufacturing process, such as the lithographic manufacturing process illustrated in FIG. 1. Block 302 represents pupil images each capturing an angular distribution of inspection radiation after it has been scattered by one or more target structures. An example pupil image is represented at 304. Such pupil images may be obtained for example by an angle-resolved scatterometer of the type described above and illustrated in FIG. 2. The pupil images may relate to zero order and/or higher order diffraction signals, as will be illustrated by examples described below. At 306, one or more properties of these pupil images are identified by image processing, which are one or more properties are correlated with one or more properties of the stack.

At 308, a database stores information obtained from other pupil images, on the same and/or historic substrates, and this database can be used to inform the manner of processing in step 306. The database 308 can contain pupil images themselves, and/or information on one or more parameters derived by processing the pupil images. At 310, the one or more pupil image properties identified in step 306 are compared with one or more pupil image properties obtained from other target structures, which are nominally the same in design, but are subject to different processing because they are at different locations on the substrate and/or at locations on substrates processed previously.

Based on the comparisons in step 310, monitoring information 312 is output, indicating the presence and optionally the degree of differences in the target structures, between different locations and/or between different substrates.

Optionally at 314, correction information is provided for improving the quality of measurements made using the inspection apparatus, or a related inspection apparatus. Examples of this processing will be described further below.

For the majority of pupil images and targets, no attempt is made to infer explicitly the actual nature of the process variations, for example whether it relates to a variation of a refractive index of material in a layer, or the layer's thickness. Such analysis would be computationally expensive, but can be performed on selected pupil images, if desired. In one implementation of the present disclosure, such analysis may be triggered specifically in response to the presence of process variation recognized simply by the image processing steps illustrated in FIG. 3. For example, based on experience and/or or modeling, a threshold level of pupil image variation can be used to trigger more detailed investigations, and/or alarms to interrupt or modify operation of the manufacturing facility.

FIG. 4 illustrates one particular implementation of a method such as illustrated in FIG. 3. Blocks that are similar in function to those of FIG. 3 have similar reference signs, prefixed '4' instead of '3'. Data 402 representing pupil images is received and subjected to processing in step 406. In this embodiment, a first step of image processing is an image segmentation step 420. In step 422, one or more types of features are detected in the segmented image. Many techniques are known for image segmentation and the present disclosure is not limited to any particular technique. Edge detection may be used for segmentation, as just one example. In an example to be described below, part-circular or arc-shaped features are particularly recognized. The output of step 422 is a collection of feature data 424 for each pupil image. Optionally the feature data is stored in the database 408.

In step 426 the depicted features are classified so as to obtain one or more parameters characterizing the images so that they may be compared. Using the example of circular/arc-shaped features, these may be counted, their radius may be measured, their intensity and/or relative intensities may be represented, and/or their position and/or relative spacing may be measured, all in the plane of the pupil image. This set of one or more image parameters 428 provide the basis for the comparison in step 410. Comparison can be only between targets on the same substrate, or between targets and similar positions on different substrates, and/or between a current target and a mass of historical targets, whose image parameters are stored in the database 408. Depending on this comparison, and on any trends and thresholds that may be defined, monitoring information 412 is generated and output. The monitoring information 412 may be, for example, a single value representing the pupil image on a scale relative to other ones that have been seen and recorded in the database. The monitoring information 412 may comprise a set of parameters characterizing the particular pupil image as a point in a multidimensional space.

FIGS. 5A and 5B demonstrate the efficacy of this image-based method, using simulations. FIG. 5A shows a plot of the relative value of a thickness parameter of a stack of layers across part of a semiconductor substrate, measured at a number of target locations represented by solid dots 502. The height at each point represents variation of the stack thickness h on an arbitrary scale, for example a percentage scale, as determined by a normal incidence reflectometer. An interpolated surface 504 is plotted, to aid visualization of stack thickness variations across the substrate. Zero on the vertical scale (h=0) corresponds to the average thickness across the substrate. Now, FIG. 5B shows a plot of measurements of an image parameter, derived by comparison of pupil images obtained from targets on the same substrate. A fewer number of targets have been sampled, than in the case of FIG. 5A, but that is relatively arbitrary. One or more image features have been recognized and classified using image segmentation, to obtain an image parameter p on an arbitrary scale. Again, the average value of this parameter p across the whole substrate has been selected to be represented by p=0 on the vertical scale. The points of measurement are represented by the solid dots 506, and the interpolated surface is shown at 508.

Comparing the plots of FIGS. 5A and 5B, the general shape of the surface 508 based on analysis of pupil images is broadly similar to the shape of surface 504 measured by a normal incidence reflectometer. In other words, although the image parameter p does not have a direct physical meaning, it still provides an indication of the presence, and magnitude, of process variations across part of the substrate. Accordingly, it is useful to output information defining the shape of the surface, or sample points, or some alarm condition, as monitoring information 412, based on the values of the image parameter p. While it is always possible, in principle, to perform a dedicated measurement of a parameter of interest, the practicalities of high-volume manufacturing mean that only limited measurement time is available. The image parameter p can be obtained with little or no additional measurement time, compared with the routine inspection operations in high-volume manufacture, and with relatively little additional computational burden, also.

In some embodiments, the image parameter p can be defined and used without any regard to its physical meaning. In other embodiments, an image parameter can be selected, or synthesized from a number of component image parameters, specifically for its correlation with a physical parameter, such as the height measured in FIG. 5A. That is to say, in a calibration phase, measurements of image parameters are performed in addition to measurements of one or more physical properties by a conventional method. An image parameter or combination of image parameters that best correlates with the physical measurements is then used as the image parameter of interest for monitoring and/or correction.

In an embodiment, where a number of image parameters define each sample point in a multidimensional space, a multivariate analysis can be performed to identify vectors that correspond to the principal components of variation. Principal component analysis (PCA) is one type of multivariate analysis that can be applied for this purpose, while other methods are also available.

In an embodiment, where image parameters are used to modify the calculation of metrology results (as described below), a combination of image parameters may evolve as part of the optimization of metrology recipes as a whole. In PCT patent application publication no. WO 2017-108453, which is incorporated herein its entirety by reference, selection of alignment mark designs and alignment recipes, as well as metrology target designs and metrology recipes, are co-optimized in a set-up phase based on comparison with reference metrology techniques. The combination of image parameters can be added as another variable in that co-optimization process.

Figure 6:
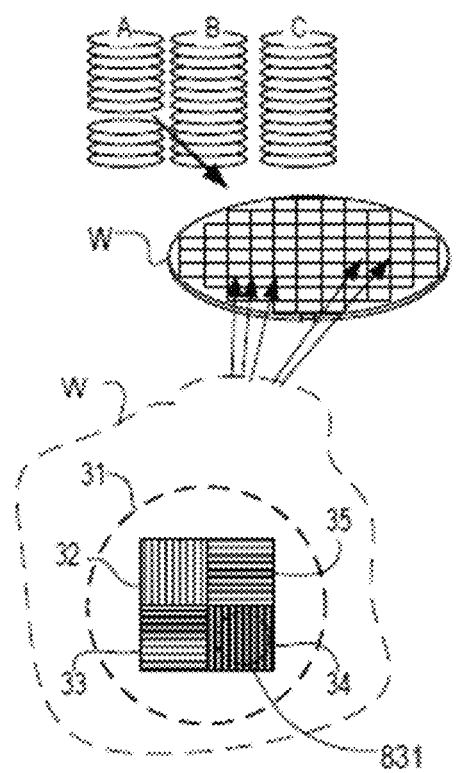
FIG. 6 illustrates a composite metrology target including a number of individual target gratings.

FIG. 6 depicts an example composite target formed on a substrate W. Instances of the composite target of the same design are formed at multiple locations in each field on substrate W, and repeated on the substrates of lots A, B and C. The composite target comprises four gratings 32 to 35 positioned closely together so that they will all be within the measurement spot S formed by the illumination beam of the metrology apparatus. A circle 31 indicates the extent of spot S on the substrate W. The four gratings thus are all simultaneously illuminated and simultaneously imaged on sensor 23. In an example dedicated to overlay measurement, gratings 32 to 35 are themselves composite gratings formed by overlying gratings that are patterned in different layers of, e.g., the semiconductor device formed on substrate W. Gratings 32 to 35 may have differently biased overlay offsets in order to facilitate measurement of overlay between the layers in which the different parts of the composite targets are formed. Gratings 32 to 35 may also differ in their orientation, as shown, so as to diffract incoming radiation in X and Y directions. In one example, gratings 32 and 34 are X-direction gratings with biases of the +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. Separate images of these gratings can be identified in the image captured by sensor 23. While four gratings are illustrated, another embodiment might use a larger matrix to obtain a desired accuracy.

Figure 7:
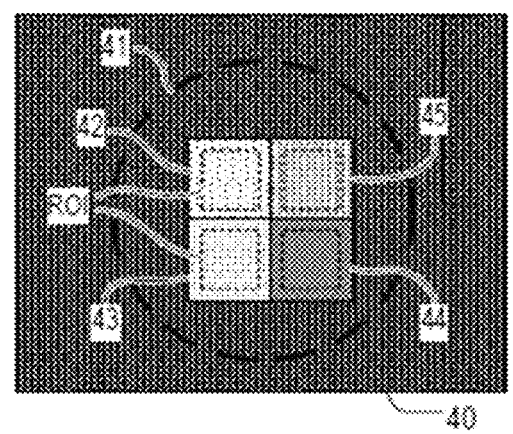
FIG. 7 illustrates an image of the target of FIG. 6, captured by the apparatus of FIG. 2A.

FIG. 7 shows an example of an image that may be formed on and detected by the sensor 23, using the target of FIG. 6 in the apparatus of FIG. 2, and using an illumination profile providing off-axis illumination in both X and Y orientations simultaneously. The dark rectangle 40 represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. Regions of interest ROI are then defined, from which diffraction signals for each grating and each diffraction order can be derived.

For measurement of an asymmetry-related parameter, such as overlay, images of the type shown in FIG. 7 should be obtained for opposite portions of the diffraction spectrum, such as +1 and −1 orders of diffraction. Using the prisms 21b instead of a simple aperture, images for +1 and −1 diffraction orders can be obtained simultaneously on different parts of the field image sensor 23. Zero order field images can also be obtained. Simultaneously, pupil images including zero and/or higher order diffraction patterns can be captured using the pupil image sensor 19.

Once the separate images of the gratings have been identified, the intensities of those individual images can be measured, e.g., by averaging or summing selected pixel intensity values within the identified areas. Intensities and/or other properties of the images can be compared with one another to obtain measurements of asymmetry for the gratings 32-35 simultaneously. These results can be combined with knowledge of the target structures and bias schemes, to measure one or more different parameters of the lithographic process. Overlay performance is an example of such a parameter, and is a measure of the lateral alignment of two lithographic layers. Overlay can be defined more specifically, for example, as the lateral position difference between the center of the top of an upper grating and the center of a lower grating of a corresponding upper-grating. To obtain measurements of other parameters of the lithographic process, different target designs can be used. Again, knowledge of the target designs and bias schemes can be combined with asymmetry measurements to obtain measurements of the desired performance parameter. Target designs are known, for example, for obtaining measurements of dose or focus from asymmetry measurements obtained in this way.

In addition to asymmetry measurements by dark-field imaging of the type described above, measurements of overlay and/or other parameters can be made by direct imaging of targets. Such methods are not excluded from the scope of the present disclosure.

Returning to the example of FIG. 7, the imaging process is subject to non-uniformities across the image field. U.S. patent application publication no. US 2012-242970 mentioned above and incorporated herein in its entirety by reference, discloses a calibration process in which, using measurements made using the same targets at different orientations and positions, a detailed set of corrections can be obtained and applied to improve the accuracy and consistency of measurements using the apparatus of FIG. 2. Similar calibration measurements and corrections can be made for asymmetries in the inspection apparatus that affect different illumination modes, for example.

Figure 8:
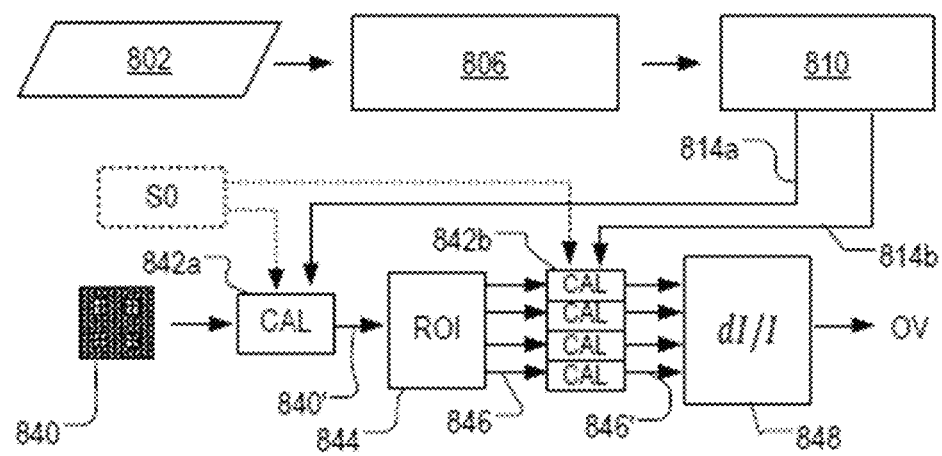
FIG. 8 illustrates an application of the methods of FIGS. 3 and 4 in an example overlay metrology method, using corrections that are adjusted based on image parameters obtained by the methods of FIGS. 3 and 4.

FIG. 8 illustrates the application of image parameters to refine the corrections in a metrology method of the type illustrated in FIGS. 6 and 7, and described in more detail in U.S. patent application publication no. US 2012-242970. Persons skilled in the art will recognize that the same principles can be applied to other types of corrections, for example the ones disclosed in U.S. patent application publication nos. US 2008-0043239 and US 2016-180517 cited herein.

The top part of FIG. 8 illustrates the obtaining of image parameters, by processing steps that are similar in function to those of FIGS. 3 and 4 and that have similar reference signs, prefixed '8' instead of '3' or '4'. For some or all of the locations on the substrate where overlay or other parameters are to be measured, pupil images are obtained and analyzed, for example by the method of FIG. 4. As an example, for some or all of the composite targets shown in FIG. 6, an additional measurement is made using a smaller spot of radiation 831, underfilling one of the component gratings, such as grating 34. In another embodiment, the spot size for the obtaining of pupil images may be the same as the spot 31, overfilling the composite grating target. In yet other embodiments, pupil images may be obtained from a different location near the metrology target of interest. The wavelength and polarization of the spot 831 may be the same as those of the spot 31 used for the overlay metrology, or they may be different. For example, analysis of pupil images obtained in visible or infrared wavelengths could be used to obtain correction information for measurements made in ultraviolet, soft x-ray or x-ray wavelengths. The optical system used to obtain the pupil images is the same, in the example of FIG. 2, as the optical system used to make the measurements, but in other embodiments they may be completely different.

Returning to FIG. 8, data 802 representing pupil images is received and subjected to processing in step 806 to identify image features. In step 810, one or more image parameters are derived, and used to generate correction information based on the one or more image parameters. The correction information corresponds to the location and/or substrate of a target currently being measured. In this example, two types of correction information 814a and 814b are shown. (The database 308 is present, but omitted for clarity of the drawing.)

In the lower part of FIG. 8, the measurement process is shown, beginning, for example, with a dark field image 840, containing +1 and −1 diffraction orders similar to the image 40 shown in FIG. 7. Calibration information has been obtained by a step S0 referred to in U.S. patent application publication no. US 2012-242970. In a first calibration step 842a, some corrections are applied based on the calibration information from step S0, for example to correct for a non-ideal response of the optical system of the inspection apparatus in different illumination modes. Corrected dark-field image data is indicated at 840'. In step 844, the regions of interest ROI in the (corrected) dark-field image 840 are identified and diffraction signals 846 for the individual gratings and diffraction orders are obtained. A second calibration step 842b applies individual corrections to these diffraction signals, based on the position of the regions of interest within the image field of the inspection apparatus. Again, this uses the calibration information from step S0, as described in U.S. patent application publication no. US 2012-242970. Corrected diffraction signals 846' are then processed in step 848 to obtain grating asymmetry values (dI/I), which in turn are used to calculate a measurement of a parameter of interest, in this case overlay OV.

The calibration steps of the type referred to in U.S. patent application publication no. US 2012-242970 have a purpose of correcting for asymmetries in the optical system and sensor response of the inspection apparatus, without the need to make additional measurements at different rotations, for example. The influence of different rotations is measured in the calibration step S0, and then effectively encoded in the calibration information. The correction in step 842a may for example comprise functions based on a set of Zernike polynomials, as an efficient way of encoding variations of response across a circular pupil. The calibration information then comprises a set of coefficients for the Zernike polynomials. The additional corrections obtained from pupil image parameters can take the form of scale factors for some or all of these coefficients, or can be input as independent parameters for use by the correction algorithms, for example using machine learning.

In accordance with the principles of the present disclosure, the first type of correction information 814a obtained from the analysis of image parameters in step 810 is used to adjust the corrections applied in the first calibration step 842a. Similarly, the second type of correction information 814b is used to adjust the corrections applied in the second calibration step 842b. In this way, the influence of process variations such as layer thickness or refractive index variations can be mitigated in a simple and computationally inexpensive manner. The adjustments of the corrections, which are used to reduce the effect of process variations, can be determined by modeling, for example, or simply by trial and error, assisted for example by machine learning techniques.

FIGS. 9 and 10 illustrate the recognition and classification of pupil image features in a first example target structure. It will be appreciated that the quality of the pupil images used in the drawings has been reduced to present them in black-and-white form for the purposes of this patent application.

In FIG. 9A an example grating structure 900 is shown in schematic cross-section. The grating structure, which may form part of a metrology target such as the one shown in FIG. 6, is formed on a silicon substrate 902. Subsequent layers comprise, for example: silicon nitride layer 904;

silicon dioxide layer 906; a tungsten grating 908 formed within the layers 904, 906; and an aluminum grating layer 910. Small features 912 in the surface of the aluminum grating layer 910 form a periodic grating structure, extending in a repeating fashion to the left and right of the drawing. In the present example, the individual features 912 are too small to be resolved by the optical system of the inspection apparatus, but they are arranged in a larger pattern with a longer period. This longer periodic structure gives rise to the diffraction orders +1 and −1 illustrated above the surface. It is assumed, for the simple example, that the layer 910 is opaque to the radiation used for measurement.

FIG. 9B shows part of the pupil image 940 that may be obtained on the pupil image sensor 19, when illuminating the grating structure 900 with a spot of radiation, such as the spot 831 shown in FIG. 6. The zero order portion of the diffraction pattern is at the center, with a +1 order portion above and a −1 portion below. The illumination profile used gives rise to the circular pattern divided into four quadrants. For a simple reflective grating, such as the one shown in FIG. 9A, the pupil image contains relatively uniform intensities within each diffraction order. However, in a more complex stack, the pupil image has a more detailed structure, as will now be illustrated in FIG. 10.

FIG. 10A shows an overlay grating structure 1000, which may be one of the component gratings 32 to 35 of the overlay metrology target shown in FIG. 6. A lower layer of the overlay grating is formed by a grating structure that is similar to the grating structure 900 of FIG. 9A. Formed on top of this, is an upper layer 1014, comprising a periodic array of features having the same period as the grating structure 900. The diffraction signals captured by the inspection apparatus are now a mixture of signals from the upper and lower layers. By the method of FIG. 8, a measurement of overlay is to be obtained. For this purpose, as already explained above, the different component gratings have different bias values of overlay, in the X and Y directions.

FIG. 10B shows an enlarged part of a pupil image for the −1 diffraction order of a grating 1000 with bias +d. FIG. 10B shows an enlarged part of a pupil image for the +1 diffraction order of the same grating. Similarly, FIG. 10D shows the part of the pupil image for the −1 diffraction order of a grating 1000 with bias −d, and FIG. 10E shows the +1 diffraction order of the same grating with bias −d. Comparing these partial pupil images with those of FIG. 9B, it can be seen immediately that the multilayered structure has produced complexity into the pupil images, that is not present in the diffraction pattern of a simple, single layer grating. This complexity includes features that are dependent on thickness and other parameters of the structure, in this case for example the thickness h of the resist layer 1014. In FIGS. 10B to 10E different features comprising straight lines and arc-shaped curves are marked with different chain dotted lines. The form and position of these features will vary with stack parameters such as the thickness h. Based on this observation, one or more image parameters representing one or more characteristics of the pupil images can be used to obtain monitoring information and/or correction information, as described above.

Figures 11A, 11B, 11C, 11D:
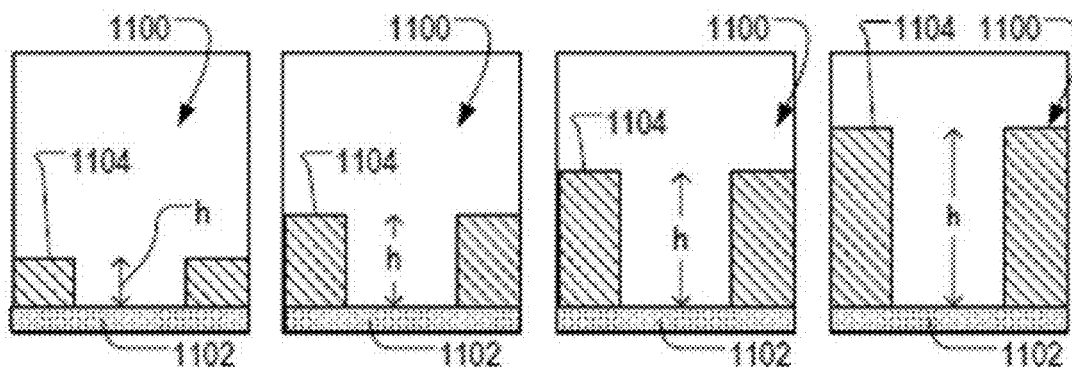
FIGS. 11A, 11B, 11C, 11D, 11E, 11F, 11G and 11H illustrate the recognition and classification of pupil image features in a second example design of target structure, with variations in layer thickness.

FIGS. 11 and 12 illustrate the recognition and classification of pupil image features in a second example design of target structure. In FIG. 11A an example grating structure 1100 is shown in schematic cross-section. The grating structure, which may form part of a metrology target such as the one shown in FIG. 6, is formed on a silicon substrate 1102. The only other layer in this example is an aluminum grating layer 1104 with thickness h. FIGS. 11B to 11D represent variations of the structure as thickness h varies across a substrate, or between substrates. The structure has been modeled, for example, with heights ranging from 200 nm (for FIG. 11A) to 800 nm (for FIG. 11D). These heights are comparable to, or even greater than, the wavelength of radiation used to obtain the diffraction patterns. Accordingly, substantial interference phenomena can occur among the rays reflected and diffracted within the height of the stack.

FIGS. 11E to 11H show simulations of the pupil images 1140 that may be obtained on the pupil image sensor 19, under the same variation of thickness h. In these pupil images, a rectangular illumination has been used, leading to rectangular portions of the pupil image corresponding to the zero order portion of the diffraction pattern at the center, with a +1 order portion to the right and a −1 portion to the left, as shown. As can readily be seen, the distribution of radiation within each order is a complex structure, and complexity increases with the increasing layer thickness.

Figures 11E, 11F, 11G, 11H:
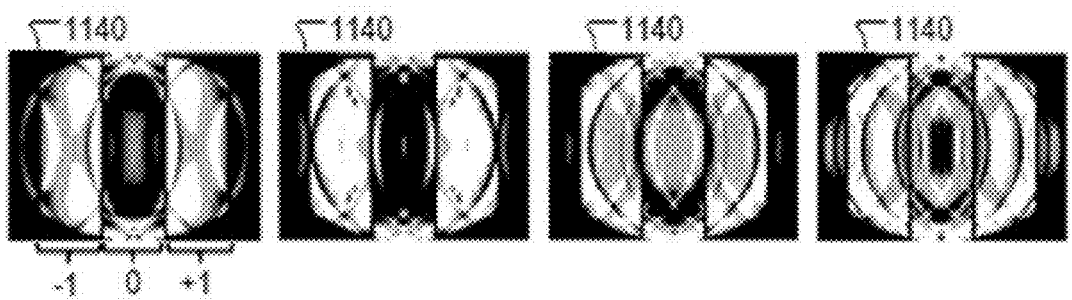
Figures 12A, 12B, 12C, 12D:
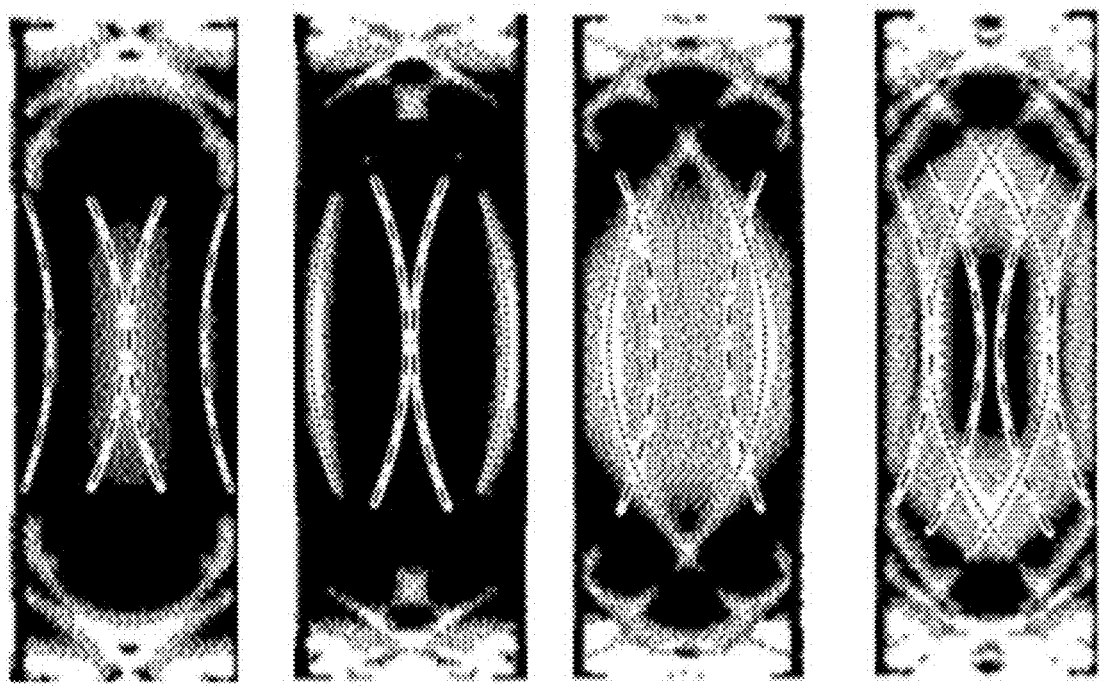
FIGS. 12A, 12B, 12C and 12D illustrate the recognition and classification of pupil image features in a second example design of target structure, with variations in layer thickness.

FIG. 12A shows enlarged the zero-order part of the pupil image 1140 for the grating 1100 with thickness h=200 nm, that is the middle section of the pupil image 1140 shown in FIG. 11E. FIGS. 12A to 12D represent the same part of the pupil image 1140 as thickness h varies from 200 nm (for FIG. 12A) to 800 nm (for FIG. 12D). This complexity includes features that are dependent on height and/or one or more other parameters of the structure, in this case for example the height h of aluminum grating layer 1104. In FIGS. 12A to 12E different features comprising straight lines and arc-shaped curves are marked with different dotted and chain dotted lines. The form and position of these features will vary with one or more stack parameters such as the height h. The number and spacing of these features also varies. The intensity of these features, and relative intensity between them also varies. Based on this observation, one or more image parameters representing one or more characteristics of the pupil images can be used to obtain monitoring information and/or correction information, as described above.

Figure 13A:
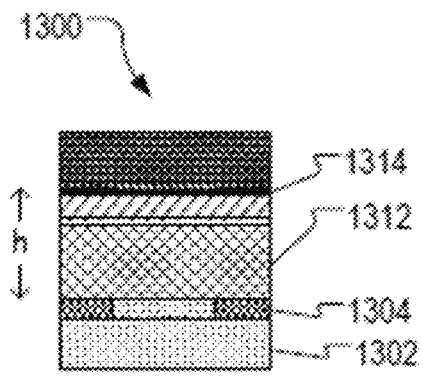
FIGS. 13A, 13B, 13C, 14A, 14B and 14C illustrate the recognition and classification of pupil image features in a third example design of target structure, with variations in layer thickness.

FIGS. 13 and 14 illustrate the recognition and classification of pupil image features in a third example design of target structure. In FIG. 13A an example overlay grating structure 1300 is shown in schematic cross-section. The grating structure 1300 may be one of the component gratings 32 to 35 of the overlay metrology target shown in FIG. 6. The overlay grating structures are formed on a substrate layer 1302 and comprises several layers in a stack. A bottom grating layer 1304 has periodic features suitable to form diffraction orders detectable in an inspection apparatus such as the scatterometer of FIG. 2, for example. Several intermediate layers including layer 1312 are provided. Formed near the top of the stack is an upper grating layer 1314, comprising a periodic array of features having the same period as the lower grating layer. The diffraction signals captured by the inspection apparatus are now a mixture of signals from the upper and lower layers. By the method of FIG. 8, a measurement of overlay is to be obtained. For this purpose, as already explained above, the different component gratings have different bias values of overlay, in the X and Y directions, which may form part of a composite metrology target such as the one shown in FIG. 6.

Figure 13B:
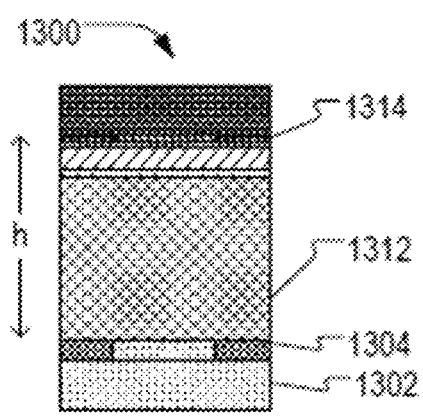
Figure 13C:
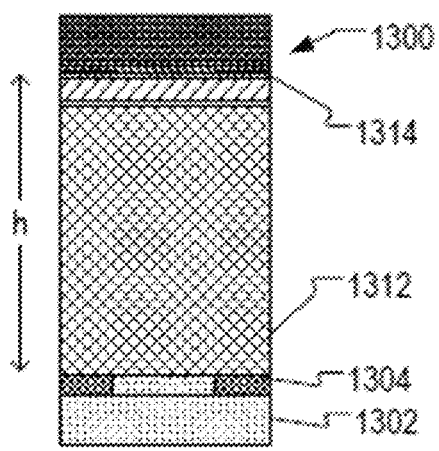

FIGS. 13B and 13C represent variations of the structure, specifically thickness h of the intermediate layer 1312 varies across a substrate, or between substrates. In this example, the target structure is formed in a 3D NAND device manufacturing process. The thickness h of the intermediate layer 1312 may be many wavelengths of the inspection radiation. The structure has been modeled, for example, with thicknesses h of 2 µm (2000 nm) (for FIG. 13A), 5 µm (for FIG. 13B) and 8 µm (for FIG. 13C). Even more than in the example of FIGS. 11 and 12, substantial interference phenomena can occur among the rays reflected and diffracted within the height of the stack.

Figure 14A:
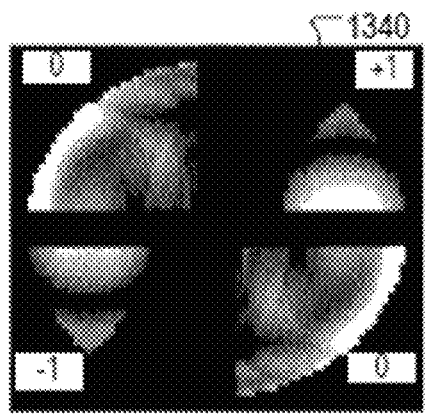
Figure 14B:
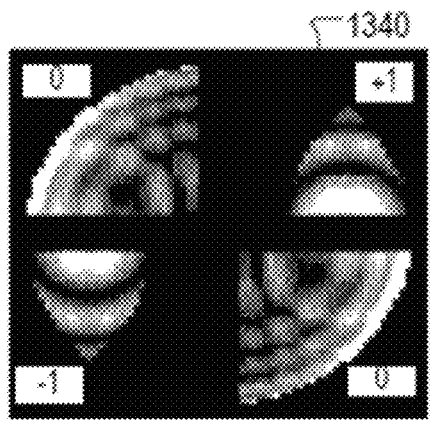
Figure 14C:
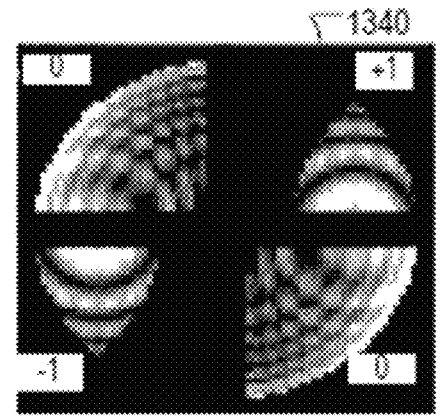

FIGS. 14A to 14C show simulations of the pupil images 1340 that may be obtained on the pupil image sensor 19, from the example of target structures of FIGS. 13A to 13C respectively. To obtain these pupil images, a segmented aperture device 13 is used in place of the unipolar apertures 13S and 13N shown in FIG. 2, while illuminating one of the gratings with a spot 831 of radiation, as seen in FIG. 6. The principles of using such a segmented aperture are disclosed in U.S. patent application publication no. US 2010-201963, and they will be described only briefly here. As described in U.S. patent application publication no. US 2010-201963, this segmented illumination profile has two bright segments (quadrants in this example) that are 180-degree symmetrical to one another. When reflected in the X and Y directions from each bright segment the distribution of illumination is dark. These directions X and Y correspond to the directions of periodicity of the vertical gratings and the horizontal gratings in the composite grating target shown in FIG. 6.

When the segmented illumination profile is used to form spot 831 on the grating 34, for example, the distribution of radiation in the pupil plane of the collection path CP becomes as shown in FIGS. 14A to 14C. The regions labeled '0' represent zero order diffraction signals from the target, while regions labeled '+1' and '-1' represent +1 and -1 order diffraction signals which have been diffracted by the grating.

As can readily be seen in FIGS. 14A to 14C, the distribution of radiation within each order has a complex structure, and complexity increases with the increasing layer thickness of the intermediate layer 1312. In FIGS. 14A to 14C, different features, including many arc-shaped curves, are noticeable. The form and position of these features will vary with one or more stack parameters such as the height h. The number and spacing of these features also varies. The intensity of these features, and relative intensity between them also varies. Based on this observation, one or more image parameters representing one or more characteristics of the pupil images can be used to obtain monitoring information and/or correction information, as described above. In this simple example, measuring the radius of the arcs, and/or counting the arcs within the pupil image can provide very directly an image parameter that is clearly related to stack height, even though it does not attempt to distinguish which layer has varied in thickness, or whether there has in fact been a variation of refractive index instead of thickness. For the purposes of signaling the presence of a process variation, such distinctions may be unnecessary. Similarly, for the purpose of adjusting corrections in the calibration of the inspection apparatus for measurement of one or more other parameters, such as overlay, such a distinction may be unnecessary.

In the examples above, measurements such as the overlay measurement and/or other asymmetry-related measurements that may be made using the inspection apparatus are based on average intensities of diffraction orders for differently biased gratings, whether in a pupil image or in a dark field image. The monitoring information and correction information can be derived from the form and distribution of features within a pupil image. Referring to the examples of FIGS. 11-12 and 13-14, it will be noted that the zero order portions of the pupil image are used in comparing images for monitoring stack variation, while higher order portions are used for the metrology purpose. This is only one possible embodiment, however, and it may be that higher orders are used for stack monitoring, instead of or in addition to zero order portions.

It would also be noted that zero order portions and higher order signals can be obtained in the same capture process. Alongside each of the pupil images 1140, 1340 captured by pupil image sensor 19, a dark field image may be captured simultaneously or nearly simultaneously using the field image sensor 23. This illustrates how the additional overhead required to obtain the monitoring information and correction information by use of one or more image parameters may be negligible. Compared with obtaining one or more physical parameters by reconstruction or other methods from pupil images, one or more image parameters can be obtained with relatively simple processing, so that they may be applied in real-time, high-volume metrology. In particular, it may be desired to apply corrections using the image parameter information in real time, as overlay measurements or other measurements are collected.

As mentioned already, the locations at which monitoring information is obtained from pupil images and image processing may be the same as, or a subset of the locations at which overlay or other measurements are being made. One or more notifications or alarms can be triggered automatically, if desired, by variation above a certain range. These one or more triggers may relate to a variation within a field on the substrate, and/or by a variation across a substrate, and/or by a variation between substrates, and/or by a variation between lots. Such diagnostic information can be used in a variety of ways.

Figure 15:
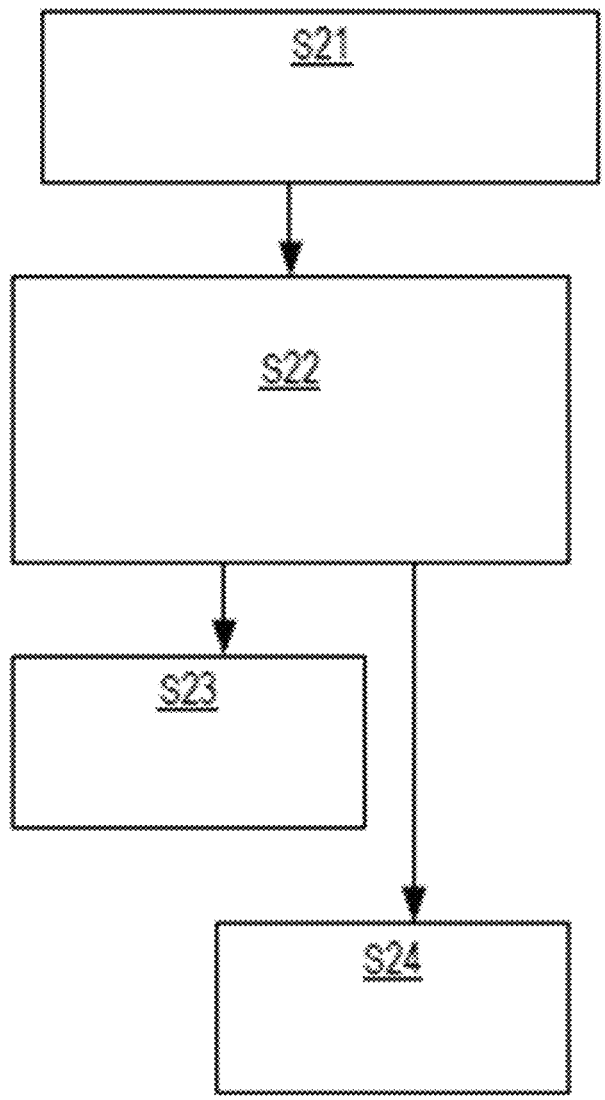
FIG. 15 is a flow chart illustrating a method of controlling performance of a metrology method and/or of a lithographic manufacturing process using measurements made by the method of FIG. 8.

FIG. 15 illustrates the application of a metrology apparatus and method of the type disclosed herein, in the control of a lithographic manufacturing facility of the type illustrated in FIG. 1. The steps will be listed here, and then explained in more detail:

S21: Process substrate to produce structures on substrate
S22: Measure CD and/or other parameter across substrate
S23: Update metrology recipe
S24: Update lithography and/or process recipe At step S21, structures are produced across a substrate using the lithographic manufacturing system. At S22, the metrology apparatus 140 and optionally one or more other metrology apparatuses and information sources are used to measure a property of the structures across the substrate, making corrections based on one or more image parameters from pupil images as discussed above. A property of interest may be for example overlay, focus, dose, CD (critical dimension) and/or EPE (edge placement error). At step S23, optionally, one or more metrology recipes and/or one or more calibrations of the metrology apparatus are updated in light of the measurement results obtained.

At step S24, measurements of overlay or one or more other parameters are compared with desired values, and used to update one or more settings of the lithographic apparatus and/or of one or more other apparatuses within the lithographic manufacturing system. By providing a metrology apparatus with correction adjusted in accordance with correction information obtained from one or more pupil image parameters, more accurate measurements can be obtained. This in turn can lead to better performance when the results of measurements are applied in further measurements and in further control of the lithographic apparatus.

CONCLUSION

There have been disclosed methods of obtaining monitoring information about process variations, without detailed measurement of physical structures. The monitoring information can be obtained in an efficient manner by image processing of pupil images, potentially using pupil images already captured as part of another measurement. One or more image parameters can be defined to characterize the pupil images in a variety of ways, including but not limited to those discussed above.

One or more image parameters derived from pupil images can also be used to generate correction information, for example to improve the accuracy of measurements made using a scatterometer or other inspection apparatus. Such pupil images may be available already as a byproduct of the metrology process; they may be obtained quickly as an additional step. The disclosed methods are therefore highly compatible with high-volume metrology in high-volume manufacturing environments.

Although specific reference may be made in this text to the use of lithographic apparatus in the manufacture of ICs, it should be understood that the lithographic apparatus and manufacturing processes described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of inspection of semiconductor substrates, embodiments of the invention may be used in other apparatus. Embodiments of the invention may form part of any apparatus or method that measures or processes an object such as a wafer (or other substrate) or mask (or other patterning device). These apparatuses may be generally referred to as lithographic tools. Such a lithographic tool may use vacuum conditions or ambient (non-vacuum) conditions.

Further embodiments according to the invention are further described in below numbered clauses:

1. A method of monitoring a manufacturing process in which multilayered product structures are formed on substrates by a combination of patterning steps, physical processing steps and chemical processing steps, the method comprising:
(a) illuminating a target structure with inspection radiation;
(b) capturing at least one image representing an angular distribution of the inspection radiation after it has been scattered by the target structure;
(c) repeating steps (a) and (b) to capture images for a plurality of nominally identical target structures formed by the manufacturing process at different locations on a substrate and/or on different substrates; and
(d) based on a comparison of the images for target structures having the same design but being formed at different locations on a substrate and/or on different substrates, inferring the presence of a difference in structure, between the different locations.

2. A method according to clause 1, wherein the presence of a difference in structure is inferred in step (d) without inferring a specific difference in structure.

3. A method according to clause 2, wherein the presence of a difference in structure is inferred in step (d) without distinguishing between changes of geometric properties and material properties within the target structure.

4. A method according to any of clauses 1-3, wherein in step (d) a degree of difference in the structures is determined, not only presence or non-presence.

5. A method according to any of clauses 1-4, wherein in step (d) image processing is performed to characterize each image by one or more image parameters, and wherein the comparison in step (d) is based on comparison of the one or more image parameters.

6. A method according to clause 5, wherein the image processing includes recognition of one or more types of features, and wherein the comparison is based at least partly on an image parameter comprising: the number of features of a first type in part of the image, the positioning of a feature of the first type within the captured image, the shape of a feature of the first type, the positioning of a feature of the first type relative to one or more other features of the first type, the intensity of a feature of the first type relative to a feature of a second type, and/or the positioning of a feature of the first type relative to one or more features of a second type.

7. A method according to clause 6, wherein the first type of feature is an arcuate feature.

8. A method according to any of clauses 1-7, further comprising:
(e) determining a parameter of performance of the manufacturing process by measuring a plurality of target structures that have been subject to the same process steps as the target structures used in step (b),
wherein in step (e) the measurement for each target structure is determined partly on the basis of the difference in structure inferred in step (d) for a target structure measured in step (b) at a corresponding location and/or substrate.

9. A method according to clause 8, wherein the measurements made in step (e) use previously determined calibration information to determine the parameter of performance based on measurement signals obtained from the target structures, and the calibration information is adjusted for each target depending on the difference inferred.

10. A method according to clause 9, wherein the calibration information defines a correction for artifacts of an inspection apparatus, and wherein a strength of the correction is adjusted in response to a degree of difference inferred for the corresponding location and/or substrate.

11. A method according to clause 9, wherein the calibration information defines a correction for stray radiation, the degree of correction depending on the inferred difference in structure.

12. A method according to any of clauses 8 to 11, wherein the measurements in step (e) are made by dark field imaging.

13. A method according to clause 12, wherein the measurements in step (e) are made using a field image sensor of an inspection apparatus, and the measurements in step (b) are made using a pupil image sensor, and wherein the illumination of step (a) and the measurements in steps (b) and (e) are made through a common objective lens.

14. A method according to clause 12 or clause 13, wherein for the measurements in step (e) a spot of inspection radiation overfills a plurality of component gratings within a composite target structure, and for the measurements in step (b) a spot of inspection radiation underfills one component grating within the composite target structure.

15. A method according to any of clauses 8 to 14, wherein the measurements in step (e) are measurements of an asymmetry-related property of the target structures.

16. A method according to any of clauses 1 to 15, further comprising outputting diagnostic information based on the difference in structure inferred in step (d).

17. A method according to clause 16, wherein the diagnostic information indicates variation of the target structures according to their location across a substrate.

18. A method according to clause 16 or clause 17, wherein the diagnostic information indicates variation of the target structures among a plurality of substrates processed over a period of time.

19. A method according to any of clauses 16 to 18, wherein the diagnostic information includes an alert generated in the event that a degree of inferred difference exceeds a certain threshold, within a substrate and/or between two substrates.

20. An apparatus for monitoring a manufacturing process in which multilayered product structures are formed on substrates by a combination of patterning steps, physical processing steps and chemical processing steps, the apparatus comprising:

a processor arranged to receive a plurality of images, each image representing an angular distribution of inspection radiation after it has been scattered by a corresponding target structure, wherein the processor is further arranged to make a comparison of the plurality of images for target structures having the same design but being formed at different locations on a substrate and/or on different substrates, and based on the comparison, to infer the presence of a difference in structure, between the different locations.

21. An apparatus according to clause 20, wherein the processor is arranged to infer a degree of difference in the structures, not only presence or non-presence.

22. An apparatus according to clause 20 or clause 21, wherein the processor is arranged to characterize each image by one or more image parameters, and to make the comparison of the images by comparison of the image parameters.

23. An apparatus according to any of clauses 20 to 22, wherein the processor is further arranged to determine a parameter of performance of the manufacturing process by processing further measurement signals obtained from a target structure that has been subject to the same process steps as the target structures mentioned in clause 20, and wherein the parameter of performance is determined by the processor partly on the basis of the inferred presence of difference in structure inferred from the images mentioned in clause 20.

24. An apparatus according to clause 23, wherein the processor is arranged to use previously determined calibration information to determine the parameter of performance based on measurement signals obtained from the target structures, and the calibration information is adjusted for each target depending on the difference inferred from the comparison of images obtained in clause 20.

25. An inspection apparatus comprising an apparatus according to clause 23 or clause 24 in combination with an illumination optical system and a detection optical system, the detection optical system being operable to obtain at least one of the images and the further measurement signals.

26. An inspection apparatus according to clause 25, wherein the further measurement signals are obtained using a field image sensor of the detection optical system and the further measurement signals are obtained using a pupil image sensor of the detection optical system, and wherein the illumination system and the detection optical system share a common objective lens.

27. An inspection apparatus according to clause 25 or clause 26, wherein the parameter of performance is determined on the basis of an asymmetry-related property of the target structures.

28. A lithographic system comprising:
a lithographic apparatus comprising an illumination optical system arranged to illuminate a pattern and a projection optical system arranged to project an image of the pattern onto a substrate; and
an apparatus according to any of clauses 20 to 23,
wherein the lithographic apparatus is controlled at least partly in response to the presence of a difference inferred by the processor.

29. A lithographic system comprising:
a lithographic apparatus comprising an illumination optical system arranged to illuminate a pattern and a projection optical system arranged to project an image of the pattern onto a substrate; and
an inspection apparatus according to any of clauses 25 to 27,
wherein the lithographic apparatus is arranged to use the parameter of performance determined by the inspection apparatus in applying the pattern to further substrates.

30. A computer program comprising processor readable instructions which, when run on suitable processor controlled apparatus, cause the processor controlled apparatus to perform the method of any of clauses 1 to 19.

31. A computer program carrier comprising the computer program of clause 30

32. A method of manufacturing devices wherein a device pattern is applied to a series of substrates using a lithographic manufacturing process, the method including:
using the method of any of clauses 1 to 19 to monitor the lithographic manufacturing process, and
controlling the lithographic manufacturing process at least partly in response to the presence of a difference inferred by the method.

Although specific reference may have been made above to the use of embodiments of the invention in the context of optical lithography, it will be appreciated that the invention, where the context allows, is not limited to optical lithography and may be used in other applications, for example imprint lithography.

According to one embodiment, at least a portion of a method described herein may be performed by a computer system in response to executing one or more sequences of one or more instructions contained in, e.g., a computer-readable medium such as a memory. Such instructions may be read into memory from another computer-readable medium. Execution of the sequences of instructions causes the computer system to perform one or more process steps described herein. One or more processors in a multi-processing arrangement may be employed to execute the sequences of instructions. In an embodiment, hard-wired circuitry may be used in place of or in combination with software instructions. Thus, the description herein is not limited to any specific combination of hardware circuitry and software.

A computer-readable medium refers to any medium that participates in providing instructions to a processor for execution. Such a medium may take many forms, including but not limited to, a non-transitory medium such as non-volatile media and volatile media. Non-volatile media include, for example, optical or magnetic disks. Volatile media include dynamic memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method of monitoring a manufacturing process in which multilayered product structures are formed on substrates by a combination of patterning steps, physical processing steps and chemical processing steps, the method comprising:
   (a) illuminating a target structure with inspection radiation;
   (b) capturing at least one image representing an angular distribution of the inspection radiation after it has been scattered by the target structure;
   (c) repeating steps (a) and (b) to capture images for a plurality of nominally identical target structures formed by the manufacturing process at different locations on a substrate and/or on different substrates and performing automated computer image processing to characterize patterns in each image by one or more image parameters, wherein the image processing includes recognition of one or more types of features; and
   (d) based on a comparison of the one or more image parameters of the images for target structures having the same design but being formed at different locations on a substrate and/or on different substrates, inferring the presence of a difference in structure, between the different locations, wherein the comparison is based at least partly on an image parameter of the one or more image parameters, the image parameter comprising: the number of features of a first type in at least part of the image, the size or dimension of a feature of the first type within the captured image, the type of shape of a feature of the first type, the positioning of a feature of the first type relative to one or more other features of the first type within the same captured image, the intensity of a feature of the first type relative to a feature of a second type, and/or the positioning of a feature of the first type relative to one or more features of a second type.

2. The method as claimed in claim 1, wherein the presence of a difference in structure is inferred in step (d) without inferring a specific difference in structure.

3. The method as claimed in claim 2, wherein the presence of a difference in structure is inferred in step (d) without distinguishing between changes of geometric properties and material properties within the target structure.

4. The method as claimed in claim 1, wherein in step (d) a degree of difference in the structures is determined, not only presence or non-presence.

5. The method as claimed in claim 1, wherein the first type of feature is an arcuate feature.

6. The method as claimed in claim 1, further comprising (e) determining a parameter of performance of the manufacturing process by measuring a plurality of target structures that have been subject to the same process steps as the target structures used in step (b),
   wherein in step (e) the measurement for each target structure is determined partly on basis the difference in structure inferred in step (d) for a target structure measured in step (b) at a corresponding location and/or substrate.

7. The method as claimed in claim 6, wherein the measurements made in step (e) use previously determined calibration information to determine the parameter of performance based on measurement signals obtained from the target structures, and the calibration information is adjusted for each target depending on the difference inferred.

8. The method as claimed in claim 7, wherein the calibration information defines a correction for artifacts of an inspection apparatus, and wherein a strength of the correction is adjusted in response to a degree of difference inferred for the corresponding location and/or substrate.

9. The method as claimed in claim 7, wherein the calibration information defines a correction for stray radiation, the degree of correction depending on the inferred difference in structure.

10. The method as claimed in claim 6, wherein the measurements in step (e) are made by dark field imaging.

11. The method as claimed in claim 10, wherein the measurements in step (e) are made using a field image sensor of an inspection apparatus, and the measurements in step (b) are made using a pupil image sensor, and wherein the illumination of step (a) and the measurements in steps (b) and (e) are made through a common objective lens.

12. The method as claimed in claim 10, wherein for the measurements in step (e) a spot of inspection radiation overfills a plurality of component gratings within a composite target structure, and for the measurements in step (b) a spot of inspection radiation underfills one component grating within the composite target structure.

13. The method as claimed in claim 6, wherein the measurements in step (e) are measurements of an asymmetry-related property of the target structures.

14. An apparatus for monitoring a manufacturing process in which multilayered product structures are formed on substrates by a combination of patterning steps, physical processing steps and chemical processing steps, the apparatus comprising:
   a processor arranged to:
      receive a plurality of images, each image representing an angular distribution of inspection radiation after it has been scattered by a corresponding target structure,
      perform automated computer image processing to characterize patterns in each image by one or more image parameters, wherein the image processing includes recognition of one or more types of features;
      make a comparison of the one or more image parameters of the plurality of images for target structures having the same design but being formed at different locations on a substrate and/or on different substrates, wherein the comparison is based at least partly on an image parameter of the one or more image parameters, the image parameter comprising: the number of features of a first type in at least part of the image, the size or dimension of a feature of the first type within the captured image, the type of shape of a feature of the first type, the positioning of a feature of the first type relative to one or more other features of the first type within the same captured image, the intensity of a feature of the first type relative to a feature of a second type, and/or the positioning of a feature of the first type relative to one or more features of a second type, and
      based on the comparison, infer the presence of a difference in structure, between the different locations.

15. The apparatus as claimed in claim 14, wherein the processor is arranged to infer a degree of difference in the structures, not only presence or non-presence.

16. The apparatus as claimed claim 14, wherein the processor is further arranged to determine a parameter of performance of the manufacturing process by processing further measurement signals obtained from a target structure that has been subject to the same process steps as the target structures, and the parameter of performance is determined by the processor partly on the basis of the inferred presence of difference in structure inferred from the images.

17. An inspection apparatus comprising the apparatus as claimed in claim 16 in combination with an illumination optical system and a detection optical system, the detection optical system configured to obtain at least one of the images and the further measurement signals.

18. A non-transitory computer-readable medium having instructions therein, the instructions, when executed by a computer system, configured to cause the computer system to at least:

obtain images for a plurality of nominally identical target structures formed by a manufacturing process at different locations on a substrate and/or on different substrates, each image representing an angular distribution of inspection radiation after the inspection radiation has been scattered by the respective target structure and the manufacturing process forming multilayered product structures on substrates by a combination of patterning steps, physical processing steps and chemical processing steps;

perform automated computer image processing to characterize patterns in each image by one or more image parameters, wherein the image processing includes recognition of one or more types of features; and based on a comparison of the one or more image parameters of the images for target structures having the same design but being formed at different locations on a substrate and/or on different substrates, infer the presence of a difference in structure, between the different locations, wherein the comparison is based at least partly on an image parameter of the one or more image parameters, the image parameter comprising: the number of features of a first type in at least part of the image, the size or dimension of a feature of the first type within the captured image, the type of shape of a feature of the first type, the positioning of a feature of the first type relative to one or more other features of the first type within the same captured image, the intensity of a feature of the first type relative to a feature of a second type, and/or the positioning of a feature of the first type relative to one or more features of a second type.

19. The computer-readable medium as claimed in claim 18, wherein the presence of a difference in structure is inferred without inferring a specific difference in structure.

20. The computer-readable medium as claimed in claim 18, wherein in the inference, a degree of difference in the structures is determined, not only presence or non-presence.

* * * * *